US 6,630,389 B2

(12) United States Patent
Shibata et al.

(10) Patent No.: US 6,630,389 B2
(45) Date of Patent: Oct. 7, 2003

(54) METHOD FOR MANUFACTURING SEMICONDUCTOR DEVICE

(75) Inventors: Takumi Shibata, Kariya (JP); Toshiyuki Morishita, Iwakura (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/059,030

(22) Filed: Jan. 30, 2002

(65) Prior Publication Data

US 2002/0106892 A1 Aug. 8, 2002

(30) Foreign Application Priority Data

Feb. 6, 2001 (JP) ........................................ 2001-029979

(51) Int. Cl.$^7$ .............................................. H01L 21/76
(52) U.S. Cl. ........................ 438/424; 438/637; 438/700; 438/672
(58) Field of Search ................................ 438/270, 296, 438/637, 424, 430, 435, 672, 445, 700; 257/135, 139, 153, 329–331

(56) References Cited

U.S. PATENT DOCUMENTS

| 5,635,423 A | * | 6/1997 | Huang et al. ................ 438/638 |
| 5,869,387 A | | 2/1999 | Sato et al. |
| 6,100,132 A | | 8/2000 | Sato et al. |
| 6,291,310 B1 | * | 9/2001 | Madson et al. ............. 438/424 |

* cited by examiner

*Primary Examiner*—D. Le
(74) *Attorney, Agent, or Firm*—Posz & Bethards, PLC

(57) ABSTRACT

In a trench-gate type power MOSFET in which a gate electrode is formed on a gate oxide layer formed on a surface of a wall defining a trench, the trench is annealed by heating, for example, at the temperature between 1050° C. and 1150° C. in a hydrogen atmosphere before the gate oxide layer is formed. The crystal defects generated in a crystal adjacent to the trench are cured by the hydrogen annealing without enlarging the trench horizontal width, so that a trench having a high aspect ratio is provided while leak current at a PN junction is prevented. In addition, the breakdown voltage of the gate oxide layer is prevented from being lowered.

14 Claims, 7 Drawing Sheets

METHOD FOR MANUFACTURING SEMICONDUCTOR DEVICE

CROSS REFERENCE TO RELATED APPLICATION

This application is based on and incorporates herein by reference Japanese Patent Application No. 2001-29979 filed on Feb. 6, 2001.

FIELD OF THE INVENTION

The present invention relates to a method for manufacturing a semiconductor device in which a gate electrode or an epitaxial layer is formed in a trench formed in a semiconductor layer. The present invention is preferably applicable to a trench-gate type MOSFET (Metal-Oxide-Silicon Field Effect Transistor) or an IGBT (Insulated Gate Bipolar Transistor), in which a gate electrode is formed in a trench.

BACKGROUND OF THE INVENTION

A trench-gate type MOSFET or an IGBT, in which a gate electrode is formed in a trench, are fabricated with steps of making the trench with RIE (Reactive Ion Etching), forming a gate oxide layer in the trench, and forming a gate electrode by filling the trench coated by the gate oxide layer with a polycrystalline silicon layer. When the trench is made, crystal defects are generated in a crystal adjacent to the trench. The crystal defects cause leak current if the defects exist at a PN junction, or poor breakdown voltage if the defects exist in the vicinity of the gate oxide. Therefore, it is proposed to reduce the crystal defects using sacrificial oxide, CDE (Chemical Dry Etching), isotropic etching with an etchant containing hydrofluoric acid and nitric acid, or the like. However, the above proposed arts are insufficient to remove the defects. In addition, in the proposed arts, the trench is etched horizontally as well, so that the trench horizontal width is increased. Thereby, the aspect ratio of the trench is decreased, and the cell pitch of the transistor is increased. Thus, it is difficult to miniaturize the device.

SUMMARY OF THE INVENTION

The present invention has been made in view of the above aspects with an object to provide a method for manufacturing a semiconductor device having a suppressed number of crystal defects without decreasing the aspect ratio. To accomplish the object, in the present invention, hydrogen annealing is applied to reduce the crystal defects.

In this invention, in a semiconductor device, an insulator layer is formed on a surface of a wall defining a trench in a semiconductor layer after annealing the trench in a hydrogen atmosphere. The crystal defects generated in a crystal adjacent to the trench are cured by the hydrogen annealing without enlarging the trench horizontally, so that a trench having a high aspect ratio is provided while the breakdown voltage of the insulator layer is prevented from being lowered. In addition, in the case that the trench is formed across a PN junction, leak current at the PN junction is prevented as well.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in detail with reference to various embodiments.

(First Embodiment)

Figure 1:
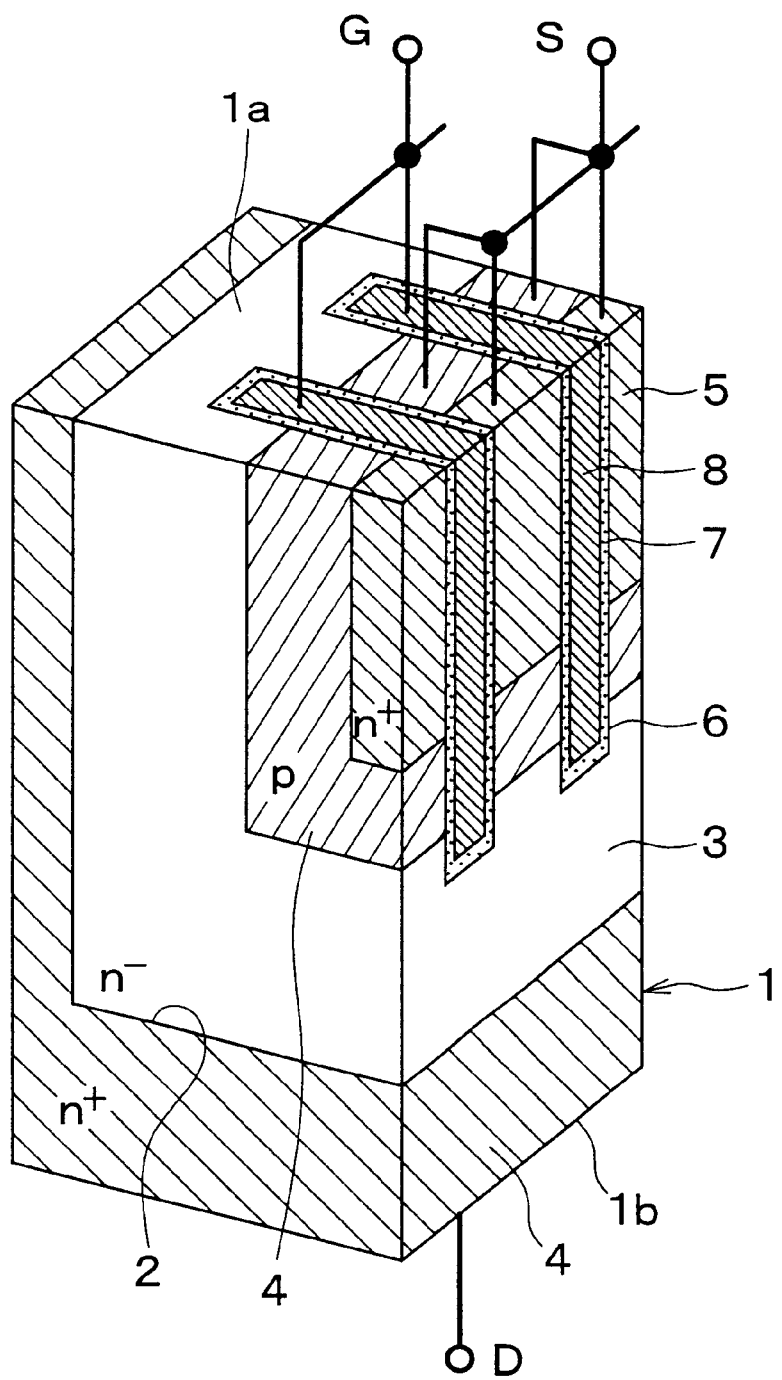
FIG. 1 is a perspective view in section showing a power MOS FET according to a first embodiment of the present invention.

The structure of a power MOS FET in a first embodiment of the present invention will be described with reference to FIG. 1. In FIG. 1, the power MOSFET is fabricated from an $n^+$-type substrate 1 having a top surface 1a as a main surface and a back surface 1b on the back side of the top surface 1a. An $n^-$-type drift layer 3 is formed in a trench 2 having a predetermined depth from the top surface 1a. A p-type base region (p-well region) 4 having a predetermined depth from the top surface 1a is formed in a predetermined region of the $n^-$-type drift layer 3. The p-type base region 4 is, for example, deeper than 15 μm and is set to be shallower than the $n^-$-type drift layer 3. An $n^+$-type source region 5 having a predetermined depth from the top surface 1a is formed in a predetermined region of the p-type base region 4. The $n^+$-type source region 5 is, for example, deeper than 15 μm and is set to be shallower than the p-type base region 4.

The $n^-$-type drift layer 3, the p-type base region 4, and $n^+$-type source region 5 are formed as follows. The trench 2 formed on the top surface 1a is filled with an $n^-$-type layer, a p-type layer, and an $n^+$-type layer in this order with an epitaxial growth technique. The three layers are etched back until the buried top surface 1a emerges.

A plurality of trenches 6 parallel to each other are formed so as to partition the $n^+$-type layer and the p-type layer into a plurality of $n^+$-type source regions 5 and a plurality of p-type base regions 4, respectively. A gate oxide layer 7 is formed on the surface defining the trench 6. Each trench 6 is filled with a gate electrode 8. On the top surface 1a of the $n^+$-type substrate 1, a gate wiring is formed to connect each gate electrode 8, and a source electrode is formed to connect each partitioned $n^+$-type source region 5 and each partitioned p-type base region 4. On the back surface 1b, which is a drain region, of the $n^+$-type substrate 1, a drain electrode is formed.

The method for fabricating the trench 6 of the power MOS FET in the first embodiment will be described in detail with reference to FIGS. 2A to 2D. As shown in FIG. 1A, a mask 10 is formed on the top surface of the $n^+$-type substrate 1. A predetermined area of the mask 10, where a trench is formed, is opened. Thereafter, a dry etching is implemented until the trench 6 having a predetermined depth is made at the opened area. The etching is stopped, and an etching-proof layer, e.g., an oxide layer is deposited on the side wall defining the trench 6. The etching is resumed to deepen the trench 6. The above process is repeated until the trench 6 has a predetermined final depth. Finally, the etching-proof layer is removed.

Figure 2A:
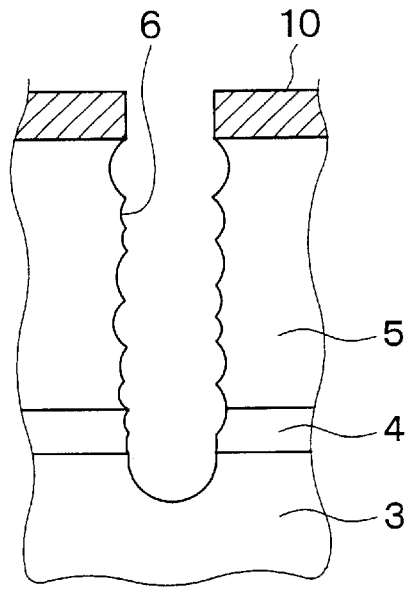
FIGS. 2A to 2D are cross-sectional views showing a fabrication method for the power MOS FET in FIG. 1.
Figure 2B:
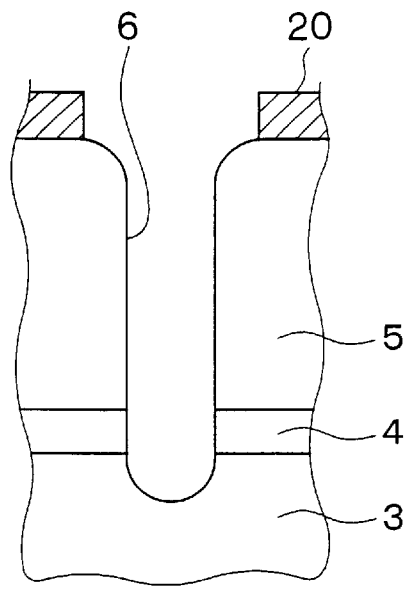

As shown in FIG. 2B, the opened area of the mask 10 is enlarged to form a second mask 20 that does not mask the top surface 1a in the vicinity of a substantially-right-angle corner at the top of the side wall of the trench 6. Therefore, the top corner and a corner at the bottom of the side wall are rounded by a subsequent hydrogen annealing. The rounded corner having a predetermined radius of curvature prevents the gate oxide layer 7 formed subsequently from thinning at an otherwise sharp corner formed by the etching. Therefore, the breakdown voltage of the gate oxide layer 7 is improved. The radius of curvature of the rounded corner is controllable by adjusting the open area size of the mask 20, as illustrated in FIGS. 4A to 4G. The wider the open area is, the larger the radius of curvature of the rounded corner becomes.

Figure 9:
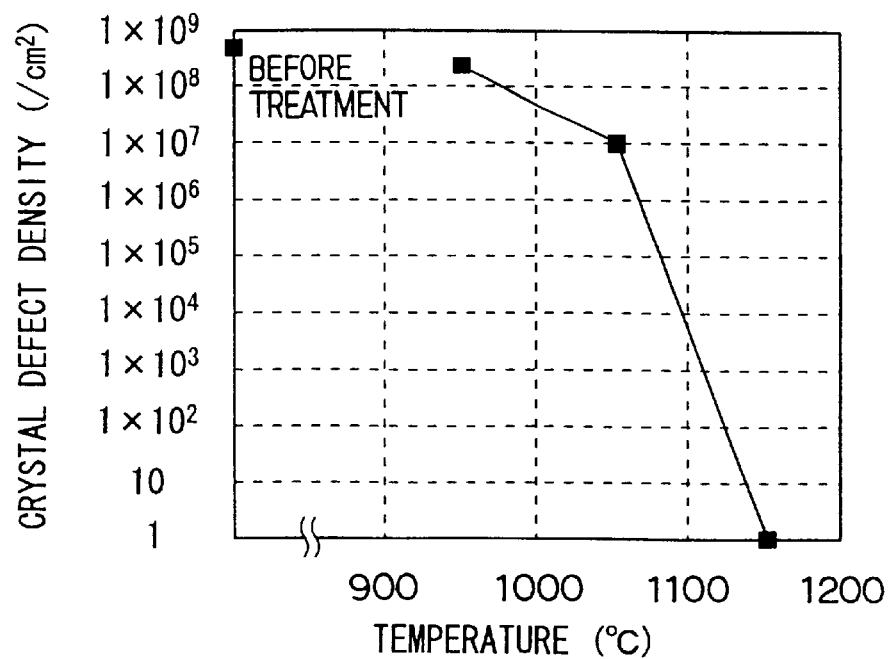
FIG. 9 is a graph showing the correlation between hydrogen annealing temperature and crystal defect density according to the studies done by the inventers.

Subsequently, a hydrogen annealing is applied to the substrate 1 by heating the substrate 1 in a hydrogen atmosphere. According to the studies by the inventors, as shown in FIG. 9, crystal defect density begins to decrease from approximately 950° C. At higher temperatures, the higher the hydrogen annealing temperature is, the lower the crystal defect density is. At 1150° C., the density becomes substantially zero. Therefore, the annealing temperature is preferably 1150° C. or higher but lower than the melting point of silicon. The heating time is preferably 300 sec. By the hydrogen annealing, crystal defects existing in the proximity of the trench 6 are cured. Therefore, crystal defect density is reduced without enlarging horizontal width of the trench 6, and the trench 6 having a high aspect ratio is formed. The hydrogen annealing is especially effective to prevent leak current caused by the defects existing in the proximity of a PN junction between the p-type base region 4 and the $n^+$-type source region 5, and to prevent breakdown voltage decrease caused by the defects existing in the proximity of the gate oxide layer 7.

Figure 3:
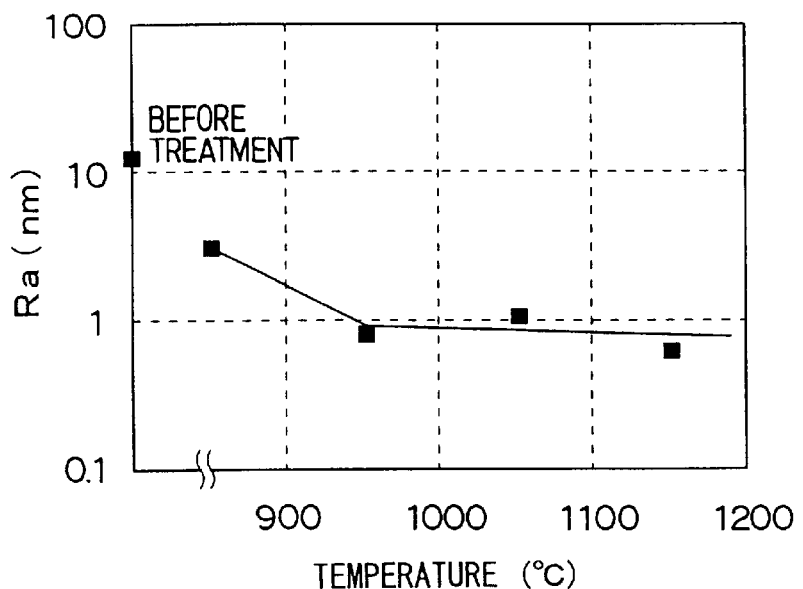
FIG. 3 is a graph showing the correlation between hydrogen annealing temperature and average surface roughness Ra.
Figure 5:
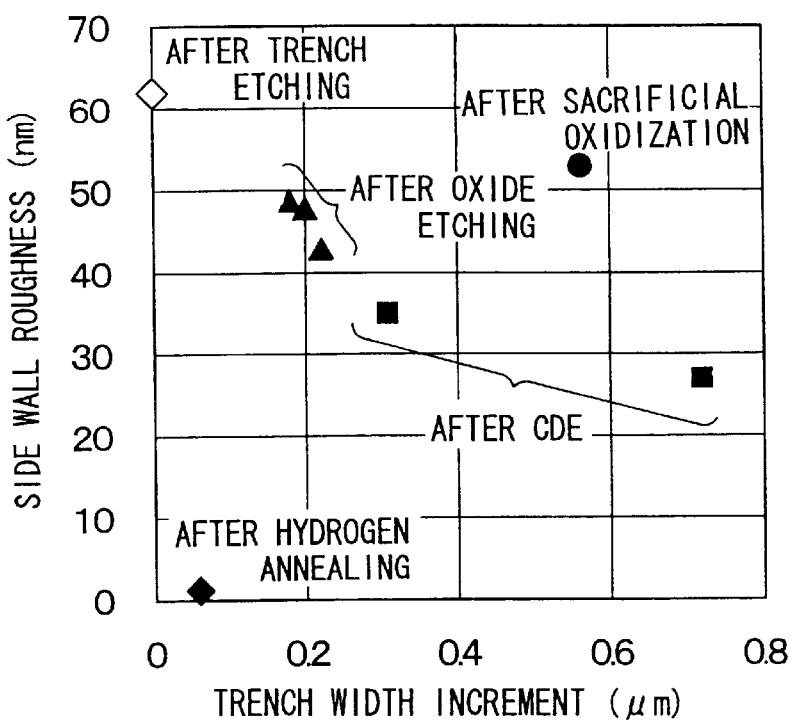
FIG. 5 is a graph showing the correlation between trench width increment and average surface roughness.
Figure 4A:
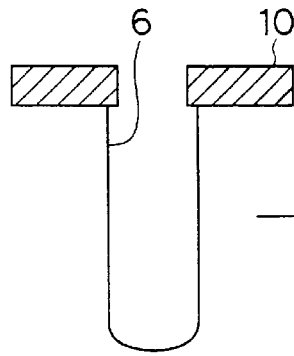
FIG. 4A is a cross-sectional view of a trench formed by etching using a first mask.
Figure 4B:
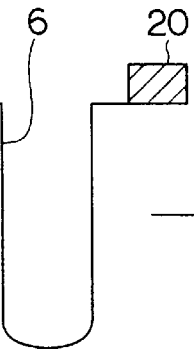
FIGS. 4B, 4D, and 4F are cross-sectional views showing second masks having respectively, a standard, a smaller, and larger open areas.
Figure 4C:
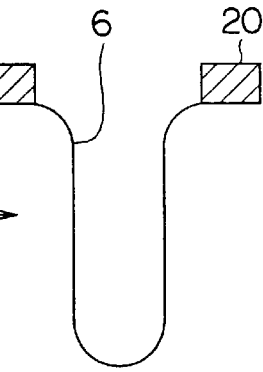
FIGS. 4C, 4E, and 4G are cross-sectional views showing rounded corners having respectively, a standard, a smaller, and larger radii of curvature at the top of side walls of each trench after hydrogen annealing.
Figure 4D:
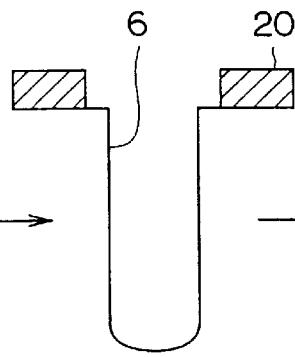
Figure 4E:
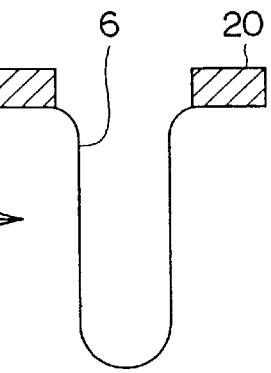
Figure 4F:
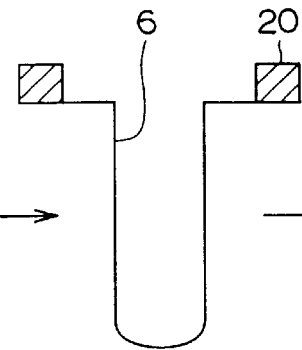
Figure 4G:
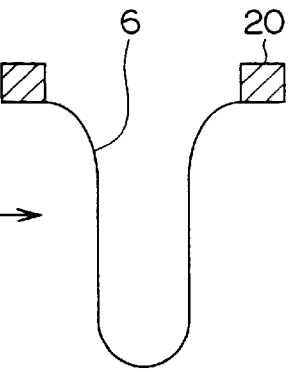

In addition to the defect reduction, the hydrogen annealing reduces the surface roughness Ra of side walls defining the trench 6. As shown in FIG. 3, the surface roughness Ra is reduced as annealing temperature rises and beginning to saturate at approximately 950° C. Therefore, the side walls defining the trench 6 are preferably smoothed by the annealing process performed at the annealing temperature as described in the first embodiment. The side walls are smoothed to some extent by sacrificial oxide, CDE (Chemical Dry Etching), or isotropic etching with an etchant containing hydrofluoric acid and nitric acid. However, in this case, the trench is enlarged horizontally, so that the horizontal width of the trench is increased much more than in the hydrogen annealing, as shown in FIG. 5. The hydrogen annealing has an additional advantage in reducing the side wall roughness substantially without enlarging the trench width.

Figure 2C:
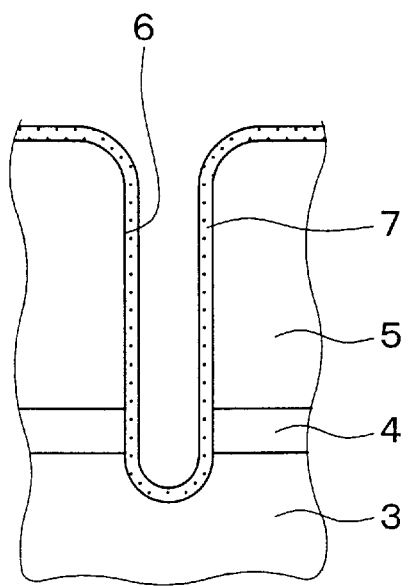
Figure 2D:
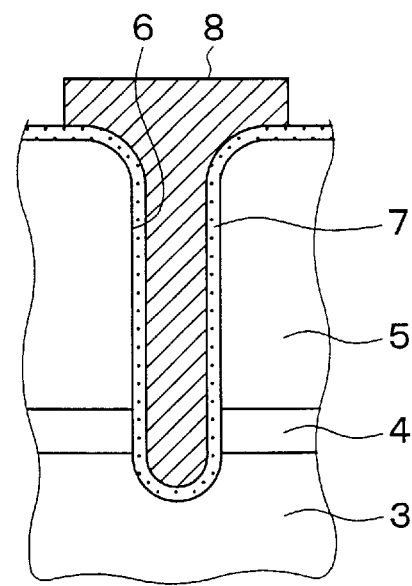

After removing the mask 20, the gate oxide layer 7 is formed by thermal oxidation, as shown in FIG. 2C. Thereafter, the trench 6 is filled with a polycrystalline silicon layer. As shown in FIG. 2D, the gate electrode 8 is formed by defining the polycrystalline silicon layer to finalize the fabrication of the trench of the power MOS FET in the first embodiment.

(Second Embodiment)

In the first embodiment, the crystal defects are suppressed only by the hydrogen annealing. In a second embodiment, the hydrogen annealing is implemented in combination with sacrificial oxide, CDE (Chemical Dry Etching), or isotropic etching with an etchant containing hydrofluoric acid and nitric acid.

Figure 6A:
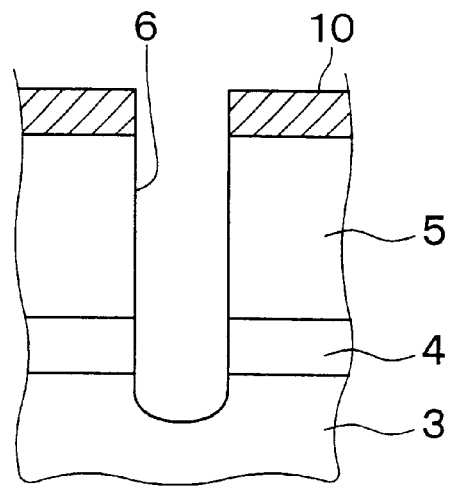
FIGS. 6A to 6C are cross-sectional views showing the mechanism of void generation in the trench in a second embodiment.
Figure 6B:
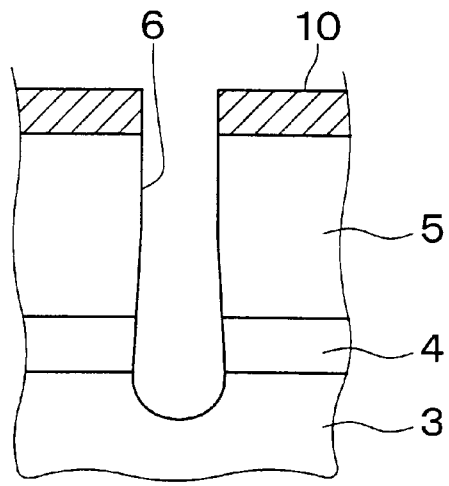
Figure 6C:
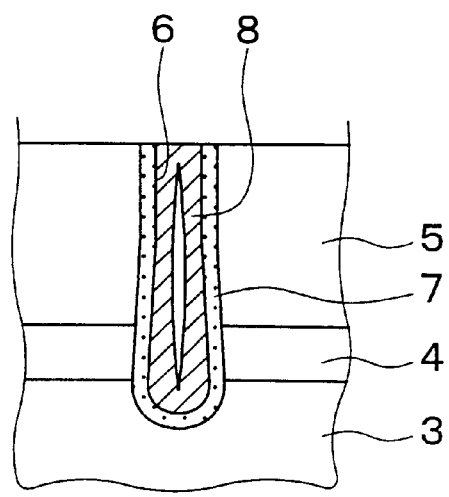

In a case that the hydrogen annealing needs so long time that the entrance of the trench 6 in FIG. 6A is narrowed as shown in FIG. 6B, a void can be generated after filling the trench 6 with poly crystalline silicon, as shown in FIG. 6C. If the void exists in the trench 6, the poly crystalline silicon in the trench electrode 8 can be unfavorably etched. In that case, the hydrogen annealing time can be shortened by removing some of the crystal defects using sacrificial oxide, CDE (Chemical Dry Etching), or isotropic etching with an etchant containing hydrofluoric acid and nitric acid.

In the second embodiment, the trench width is enlarged due to the utilized isotropic etching. However, the increment of the width is significantly smaller than that in the case that the defects are removed only by the isotropic etching.

(Third Embodiment)

In above embodiments, the hydrogen annealing is applied to a process in which the gate electrode 8 is embedded in the trench 6. In a third embodiment, the hydrogen annealing is applied to another process.

Figure 7:
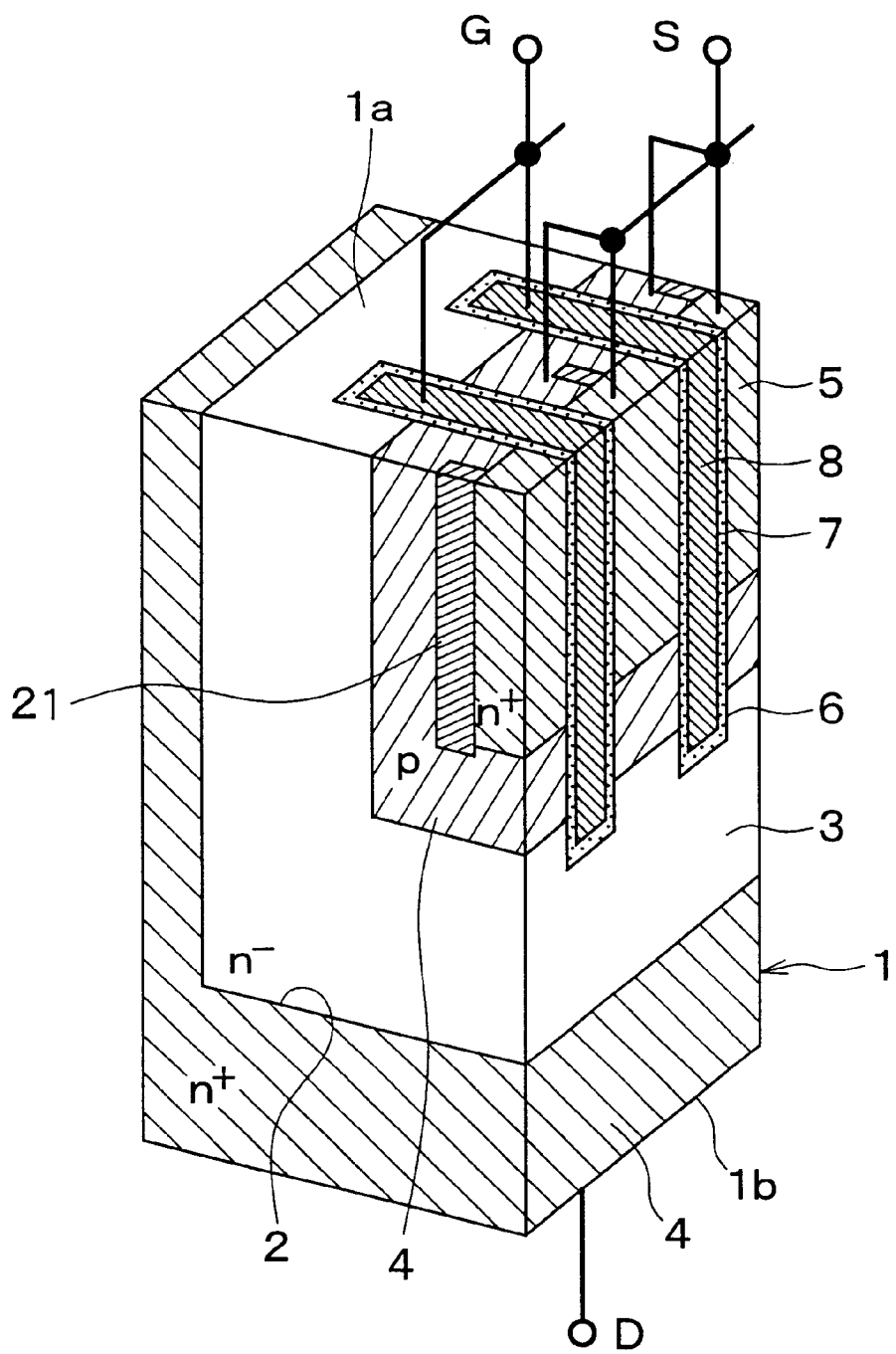
FIG. 7 is a perspective view in section showing a power MOS FET according to a third embodiment of the present invention.

As shown in FIG. 7, a $p^+$-type region 21 is embedded at a part of the boundary between the p-type base region 4 and the $n^+$-type source region 5. The $p^+$-type region 21 is formed by the steps of forming the $n^-$-type drift layer 3, the p-type base region 4, and the $n^+$-type source region 5, thereafter forming a trench at the part of the boundary between the p-type base region 4 and the $n^+$-type source region 5, and filling the trench with the $p^+$-type region 21. The hydrogen annealing is applied to the trench in order to reduce crystal defects generated in the vicinity of the trench.

In this embodiment, the trench filled with the $p^+$-type region 21 is disposed so as to contact a PN junction between the p-type base region 4 and the $n^+$-type source region 5. In this embodiment, the hydrogen anneal prevents leak current at the PN junction.

(Fourth Embodiment)

Figure 8A:
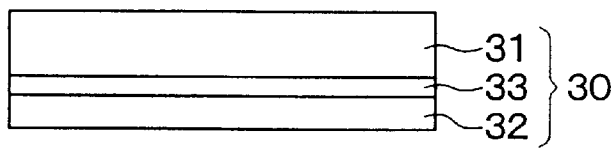
FIGS. 8A to 8C are cross-sectional views showing a method for forming an insulated island on an SOI substrate according to a fourth embodiment of the present invention.
Figure 8B:
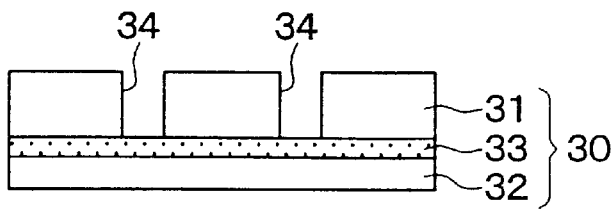
Figure 8C:
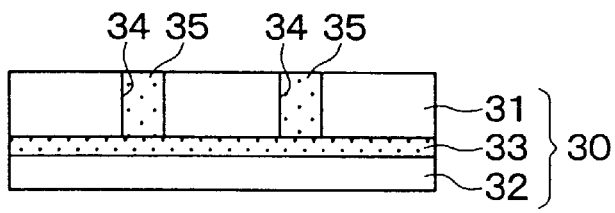

As shown in FIGS. 8A to 8C, the hydrogen annealing is applied to a process in which a trench is made for forming an insulated island on an SOI (Silicon on Insulator) substrate. As shown in FIG. 8A, an SOI substrate 30 is constituted of an active layer 31, on which element devices are formed, a substrate 32, and an oxide layer 33 interposed between the active layer 31 and the substrate 32. A trench 34 reaching the oxide layer 33 is formed as shown in FIG. 8B. Thereafter, the trench 34 is filled with an insulator layer 35 to finalize the insulation process.

The hydrogen annealing is applied to the trench in order to reduce crystal defects generated in the vicinity of the trench 34. Thereby, the leak current due to the crystal defects is prevented and so is breakdown voltage decrease of the insulator layer 35.

(Modification)

In the first embodiment, the second mask 20 is formed by enlarging the opened area of the mask 10. However, the second mask 20 may be formed by removing the mask 10 and reforming a mask having an enlarged open area.

In the second embodiment, the isotropic etching is implemented before the hydrogen annealing using sacrificial oxide, CDE (Chemical Dry Etching), or isotropic etching with an etchant containing hydrofluoric acid and nitric acid. However, the isotropic etching may be implemented after the hydrogen annealing.

The above embodiments may be applied to an IGBT in which the n$^+$-type substrate 1 in FIG. 1 is substituted with a p$^+$-type substrate, a trench-gate vertical type power MOSFET, and a trench-gate vertical type IGBT.

The above embodiments may be modified further within the spirit of the present invention.

What is claimed is:

1. A method for manufacturing a semiconductor device comprising:

enlarging the open area of the first mask to form a trench in a semiconductor layer;

etching the semiconductor layer using a first mask having an open area where the trench is formed;

forming a second mask having a larger open area than that in the first mask before annealing the trench;

annealing the trench in a hydrogen atmosphere to round at least one of a top end corner and a bottom end corner of a side wall defining the trench; and forming an insulator layer on a surface of a wall defining the trench.

2. The method of claim 1 further comprising:

forming a gate electrode on the insulator layer to provide a trench-gate type semiconductor device.

3. The method of claim 1, further comprising setting respective sizes of the first and second masks such that a radius of curvature at the top end corner of the side wall defining the trench is to be larger than that of the bottom end corner.

4. The method of claim 1, further comprising forming the second mask by enlarging the open area of the first mask.

5. The method of claim 1, further comprising:

etching isotropically the surface of a wall defining the trench with an etchant containing hydrofluoric acid and nitric acid, or by a dry etching, or utilizing sacrificial oxide before the annealing of the trench.

6. The method of claim 1, further comprising:

etching isotropic ally the surface of a wall defining the trench with an etchant containing hydrofluoric acid and nitric acid, or by a dry etching, or utilizing sacrificial oxide after the annealing of the trench.

7. The method of claim 1, wherein a temperature during the annealing is between 1050° C. and a melting point of silicon.

8. The method of claim 7, wherein a temperature during the annealing is 1150° C. or higher.

9. The method of claim 1, wherein the forming of the trench comprises forming the trench so that the trench crosses or borders on a PN junction.

10. The method of claim 1, wherein the forming of the trench comprises forming the trench so that the trench separates the semiconductor layer into a plurality of regions insulated from each other.

11. A method for manufacturing a semiconductor device comprising:

forming a mask that has a first open area on a semiconductor layer;

etching the semiconductor layer using the mask to form a trench at an area where the first open area is located;

enlarging the first open area of the mask to form a second open area;

annealing the trench in a hydrogen atmosphere using the mask having the second open area to round a top end corner of a side wall defining the trench, wherein a radius of curvature at the top end corner after the annealing is controlled by adjusting sizes of the first open area and second open area; and forming an insulator layer on the side wall.

12. The method of claim 11 further comprising forming a gate electrode on the insulator layer to provide a trench-gate type semiconductor device.

13. The method of claim 11, wherein a temperature during the annealing is between 1050° C. and a melting point of silicon.

14. The method of claim 11, wherein a temperature during the annealing is 1150° C. or higher.

* * * * *